(12) United States Patent
Lee et al.

(10) Patent No.: US 6,844,088 B2
(45) Date of Patent: Jan. 18, 2005

(54) BISPHENYLENE-SPIROBIFLUORENE COMPOUNDS, METHOD FOR SYNTHESIZING THE SAME, AND ELECTROLUMINESCENCE MATERIAL AND DEVICE HAVING THE SAME

(75) Inventors: Hyoyoung Lee, Taejon (KR); Jiyoung Oh, Taejon (KR); Hye Yong Chu, Taejon (KR); Jeong Ik Lee, Kyunggi-do (KR); Seong Hyun Kim, Taejon (KR); Lee-Mi Do, Taejon (KR); Taehyoung Zyung, Taejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 151 days.

(21) Appl. No.: 10/007,171

(22) Filed: Nov. 30, 2001

(65) Prior Publication Data

US 2003/0044642 A1 Mar. 6, 2003

(30) Foreign Application Priority Data

Aug. 7, 2001 (KR) .......................................... 2001-47452

(51) Int. Cl.$^7$ .......................... H05B 33/14; C09K 11/06; C07C 43/20
(52) U.S. Cl. ...................... 428/690; 428/917; 313/504; 252/301.16; 568/632
(58) Field of Search ................................ 428/690, 917; 313/504, 506; 257/40, 103; 252/301.16, 301.35; 564/426; 568/58, 632; 556/87, 400, 432

(56) References Cited

U.S. PATENT DOCUMENTS 5,840,217 A * 11/1998 Lupo et al. ................. 252/583

FOREIGN PATENT DOCUMENTS

JP 11-273863 10/1999

* cited by examiner

Primary Examiner—Marie Yamnitzky
(74) Attorney, Agent, or Firm—Blakely Sokoloff Taylor & Zafman

(57) ABSTRACT

Bisphenylene-spirobifluorene compounds, a method for synthesizing the same, and EL material and device having the same. The bisphenylene-spirobifluorene compound is defined by the following formula:

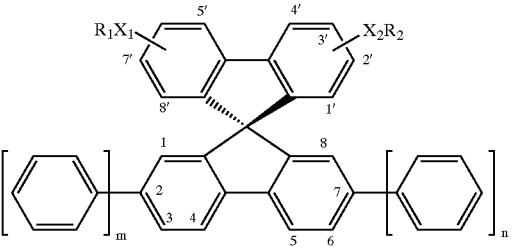

wherein $R_1$ and $R_2$ are identical or different and are independently a straight-chain or branched alkyl group having from 1 to 22 carbon atoms, $X_1$ and $X_2$ independently contains one or more elements selected from the group consisting of C, O, N, S, Si and Ge, and m and n are integers from 1 to 4.

7 Claims, 9 Drawing Sheets

BISPHENYLENE-SPIROBIFLUORENE COMPOUNDS, METHOD FOR SYNTHESIZING THE SAME, AND ELECTROLUMINESCENCE MATERIAL AND DEVICE HAVING THE SAME

BACKGROUND OF THE INVENTION

1. Field of the Invention

The present invention relates to an organic electroluminescence (EL) compound, a method for synthesizing the same, and an EL material and device having the same, and more particularly, to bisphenylene-spirobifluorene compounds, a method for synthesizing the same, and EL material and device having the same.

2. Description of the Related Art

In general, an electroluminescence (EL) device using low molecular weight materials is formed by sequentially depositing a transparent electrode, an electrically conducting buffer layer, a light-emitting layer, an electron transport layer and a metal electrode on a substrate under high vacuum. If the transparent electrode and the metal electrode are connected to positive (+) and negative (−) terminals of power, holes are supplied to the hole transport layer and the light-emitting layer through the transparent electrode and electrons are supplied to the light-emitting layer through the metal electrode. The holes and electrons supplied to the light-emitting layer are combined therein, thereby achieving luminescence. Since organic EL devices are quick in response, driven at a low operating voltage and self-illuminating, they require no additional back light source, making them small and lightweight. Also, the organic EL devices have excellent luminance and are not dependent upon viewing angle of display.

Types of light-emitting materials forming the organic EL devices include low molecular weight organic materials and organic polymer materials. While the low molecular weight organic material is subjected to vacuum deposition to form a thin film on a substrate, the organic polymer material is molten in an organic solvent to be subjected to spin coating to form a thin film on a substrate. The low molecular weight organic luminescence device is described in detail in U.S. Pat. No. 4,539,507.

Since the color of light emitted is varied according to the band gap of light-emitting molecule, it is quite important to develop red (R), green (G) and blue (B) emission materials having high luminance at low voltages while maintaining high color purity according to the wavelength of light emitted. Development of B emission materials is, inter alia, highly demanded. This is because one of full-color organic EL device implementation methods, that is, RGB emission, can be implemented by forming a blue emission layer, depositing a color change material (CCM) capable of adjusting wavelengths and converting blue emission having the highest energy into green and red emissions.

As materials to emit blue fluorescent light, polyphenylenes having phenylene as a basic unit were reported by J. M. Tour in 1991 (Adv. Mater. 1994, 6, No. 3, pp. 190–198). However, these materials have poor solubility while they are excellent in view of thermal stability and color purity. Also, since it was known that materials having fluorenes, which are pseudo materials of phenylenes, as a basic unit, are promising, a great deal of research into these materials has been made hereto.

Woo, Inbasekaran, Shiang and Roof developed EL polymers using a polymerization technique of polymers, called Suzuki coupling, and disclosed poly(fluorene) based EL materials in WO 97/05184 in 1997. In 1999, poly(fluorenes) with polar side chains were proposed by Pei, Yu and Yang, but the polar side chains promote formation of excimer, which is one of the problems with poly(fluorene), resulting in degradation in color purity (see U.S. Pat. No. 5,900,327 and J. Appl. Phys., Vol. 81, pp 3294–3298). In order to solve the problem of degradation in color purity of blue light-emitting electrochemical cells due to formation of excitons by conventional poly(fluorenes), Chen, Klaerner, Miller and Scott of IBM Corporation developed poly(anthracene-cofluorene) copolymers obtained by copolymerizing the poly(fluorenes) with anthracenes (see U.S. Pat. No. 5,998,045). As described above, fluorene-based B light-emitting materials with high blue color purity and emission efficiency have been developed. However, planarity of fluorene molecules causes an excimer phenomenon in which the fluorene molecules get easily closer to each other than non-planar molecules, resulting in a change in wavelength of light emitted. The excimer phenomenon makes it difficult to maintain color purity.

In practice, one of B emission materials being currently in widespread use is a compound of distyrylarylene (DSA) based 1,4-bis(2,2-diphenylvinyl)biphenyl (DPVBi) proposed by Hosokawa, Higashi, Nakamura and Kusumoto, in Appl. Phys. Lett. 67 (26), 3853, 1995, and manufactured by Idemitsu Kosan Co., Ltd. Here, the luminance was 6,000 $cd/m^2$ and the emission efficiency was 0.7 to 0.8 lm/W. Also, it was reported that the DSA-based compound improved approximately two times in luminance and emission efficiency, that is, 10,000 $cd/m^2$ and 1.5 lm/W, when it is used with a doping material. The DPVBi used herein has a non-planar molecular structure due to steric inhibition of an arylene substituent.

Accordingly, preparation of spirobifluorene compounds having properties of fluorenes and non-planar molecular structures, and organic EL devices thereof, are being vigorously studied.

Kreuder, Lupo, Salbeck, Schenk and Stehlin disclosed poly(spirobifluorenes) having a spiro framework and copolymers thereof (see U.S. Pat. No. 5,621,131). Also, they disclosed EL materials of new spiro low molecular weight materials or polymers having a spiro framework other than spirobifluorene or having a hetero element substituted for 9,9'-positioned carbon element (see U.S. Pat. Nos. 5,741,921, 5,763,636 and 5,859,211). U.S. Pat. No. 5,840,271 to Lupo et al. discloses methods of synthesizing low molecular weight and polymer compounds of 2,7-diphenylene-9,9'-spirobifluorene and 2,2'-diphenylene-9,9'-spirobifluorene having two identical phenylene groups substituted in 2,7- or 2,2'-positions. Although the structure free of alkyl substituent was effective in maintaining color purity and color stability, the processibility of the low molecular weight or polymer materials was poor. In other words, since such material has poor solubility in organic solvents, its film-forming properties are poor.

In order to overcome the poor film-forming properties, Rietz et al. reported in U.S. Pat. No. 6,132,641 that 2,2'-dialkyl-9,9'-bisspirofluorene having alkyl side chains introduced in 2,2'-positions and its polymer 2,2'-dialkyl-7,7'-poly(9,9'-spirobifluorene) have improved solubility in organic solvents and improved polymer film forming properties in EL device applications.

SUMMARY OF THE INVENTION

To solve the above-described problems, it is a first object of the present invention to provide alkyl substituted bisphenylene-spirobifluorene compounds configured to improve film forming properties while maintaining high blue color purity and enhancing color stability of spirobifluorene.

It is a second object of the present invention to provide a method of preparing bisphenylene-spirobifluorene compounds, based on spirobifluorene molecular structure, which can substitute alkyl side chains at desired positions to increase film forming properties.

It is a third object of the present invention to provide EL materials containing new bisphenylene-spirobifluorene compounds.

It is a fourth object of the present invention to provide an EL device having a light-emitting layer containing a new bisphenylene-spirobifluorene compound having a structure in which alkyl substituent is introduced at a new position to implement a device with high efficiency, high color purity and excellent color stability.

To accomplish the first object, the present invention provides a bisphenylene-spirobifluorene compound defined by the following formula:

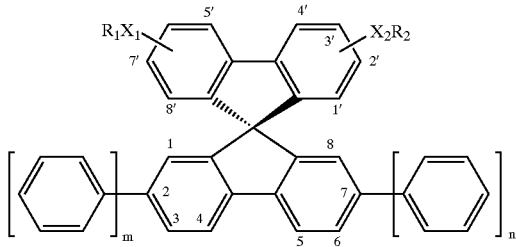

Wherein $R_1$ and $R_2$ are identical or different and are independently a straight-chain or branched alkyl group having from 1 to 22 carbon atoms, $X_1$ and $X_2$ independently contains one or more elements selected from the group consisting of C, O, N, S, Si and Ge, and m and n are integers from 1 to 4. Preferably, $X_1R_1$ and $X_2R_2$ are at 1',6'-positions.

To achieve the second object of the present invention, a method of preparing bisphenylene-spirobifluorene compound includes the step of forming a biphenyl compound having $X_1R_1$ and $X_2R_2$ in which $R_1$ and $R_2$ are identical or different and are independently a straight-chain or branched alkyl group having from 1 to 22 carbon atoms, and $X_1$ and $X_2$ independently contains one or more elements selected from the group consisting of C, O, N, S, Si and Ge. Then, a biphenylyl-halogenated fluoreneol compound having the $X_1R_1$ and $X_2R_2$ is formed by reacting the biphenyl compound with halogenated fluoreneone. A halogenated spirobifluorene compound having the $X_1R_1$ and $X_2R_2$ is formed from the biphenylyl-halogenated fluoreneol compound by cyclization. Then, a bisphenylene-spirobifluorene compound having the $X_1R_1$ and $X_2R_2$ is formed by substituting halogen of the halogenated spirobifluorene compound by a phenyl group.

In the step of forming the biphenylyl-halogenated fluoreneol compound, a metal-halogen ligand substitution reaction is preferably employed.

Also, in the step of forming the biphenylyl-halogenated fluoreneol compound, a slightly excess amount of halogenated fluorene-one is preferably added.

To achieve the third object of the present invention, there is provided an electroluminescence (EL) material comprising the bisphenylene-spirobifluorene compound defined by the formula stated above. The bisphenylene-spirobifluorene compound is preferably contained in an amount of 10% by weight or more.

To achieve the fourth object of the present invention, there is provided an electroluminescence (EL) device including a cathode, an anode, and a light-emitting layer interposed between the cathode and the anode and containing the EL material according to the present invention. Preferably, the bisphenylene-spirobifluorene compound is contained in the light emitting layer in an amount of 10% to 100% by weight.

The bisphenylene-spirobifluorene compound according to the present invention has a structure in which alkyl substituent is introduced at a new position to increase the solubility in organic solvents and reduce excimer formation. Its color purity and color stability are good and it is highly soluble in organic solvents, thereby providing excellent processibility. Also, the bisphenylene-spirobifluorene compound according to the present invention can provide blue organic EL materials having excellent properties as electronic materials, including light transmissivity, environment resistance, adhesive strength with respect to a substrate, film forming properties, electrical field stability. Further, it is possible to remarkably reduce crystallization, which frequently occurs to a planar organic matter during formation of a thin film in forming a light-emitting layer of an EL device, thereby prolonging the life cycle of the EL device.

BRIEF DESCRIPTION OF THE DRAWINGS

The above objects and advantages of the present invention will become more apparent by describing in detailed preferred embodiments thereof with reference to the attached drawings in which.

DETAILED DESCRIPTION OF THE INVENTION

Figure 1:
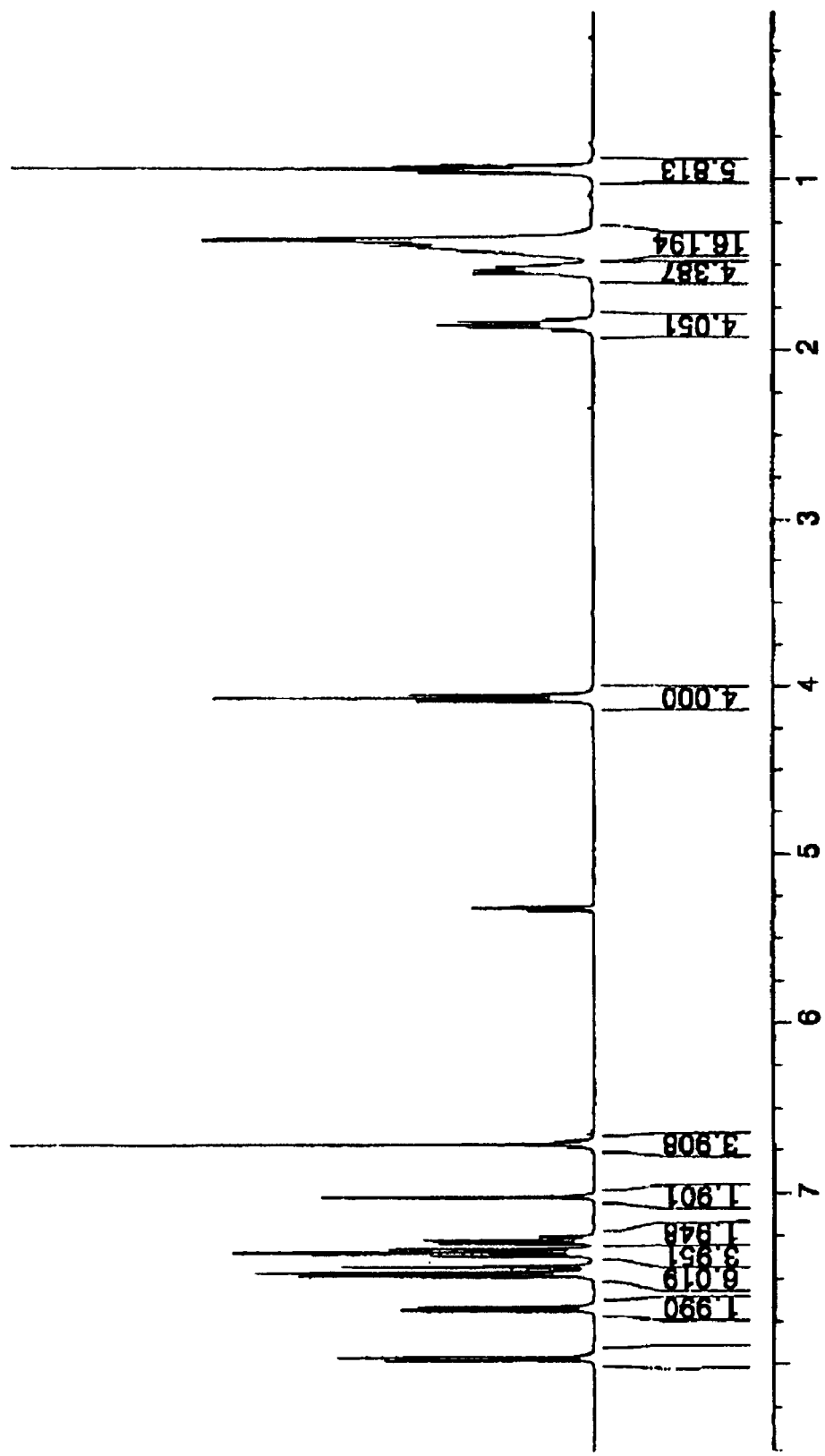
FIG. 1 is a proton nuclear magnetic resonance (NMR) of a compound VI-1 (m=1, n=1) prepared in Example 6.

Bisphenylene-spirobifluorene compounds according to the present invention can be prepared by a synthesis method represented by the reaction scheme 1:

[Reaction scheme 1]

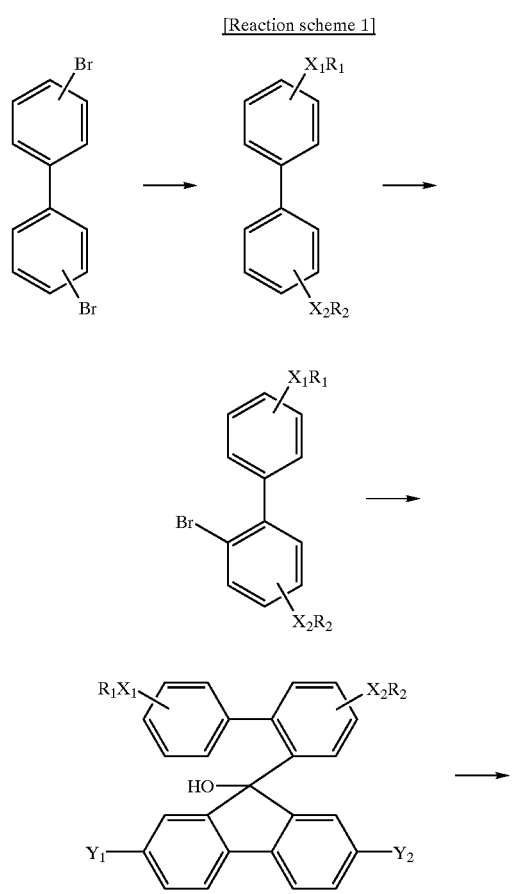

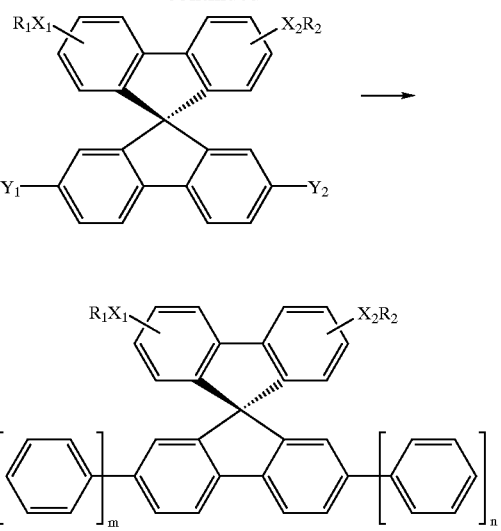

wherein $R_1$ and $R_2$ are identical or different and are independently a straight-chain or branched $C_1$–$C_{22}$ alkyl group, $X_1$ and $X_2$ each contains one or more elements selected from the group consisting of C, O, N, S, Si and Ge, $Y_1$ and $Y_2$ are independently halogens, and m and n are integers from 1 to 4.

The reaction scheme 2 illustrates synthesis of a bisphenylene-spirobifluorene compound in the case where $X_1$ and $X_2$ are oxygen atom (O) in the reaction scheme 1, depicting that alkyl groups are selectively introduced into 3',6'-positions or 1',6'-positions of the spirobifluorene compound and phenyl groups are introduced into 2,7-positions.

[Reaction scheme 2]

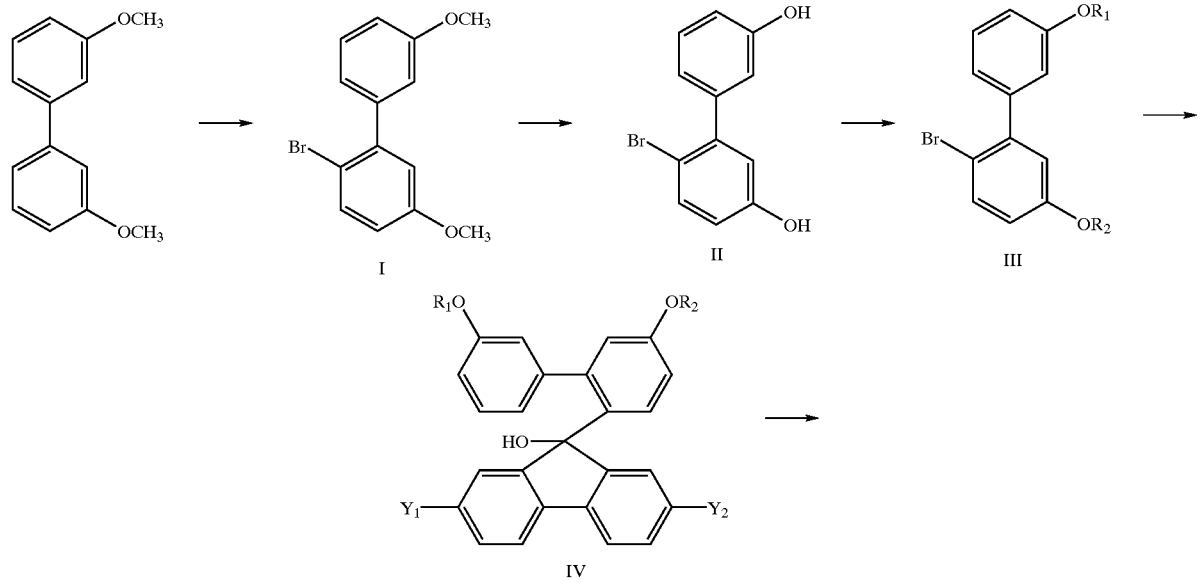

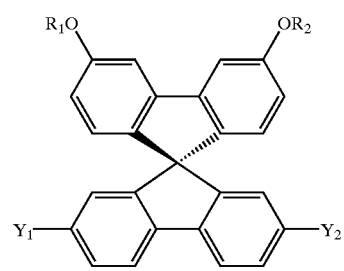

V-1

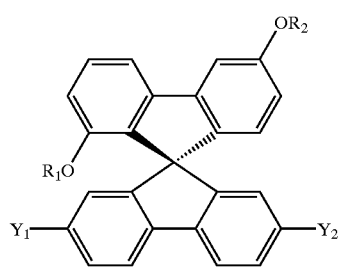

V-2

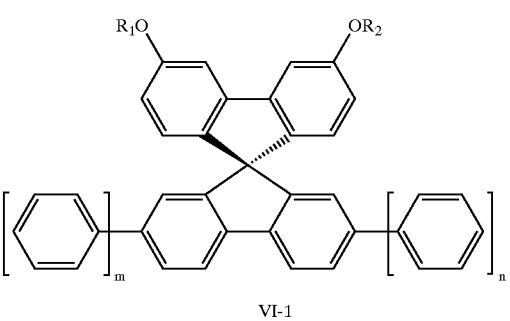

VI-1

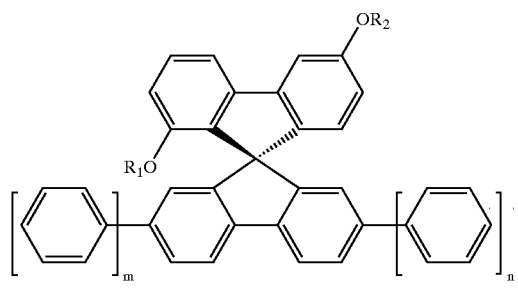

VI-2

The method of synthesizing the bisphenylene-spirobifluorene compound according to the present invention represented by the reaction scheme 2 will now be described in detail. In order to prepare a spiro compound, a halogen element must be fixed at the 2-position of biphenyl. Several different 2-bromobiphenyl derivatives having one or two alkoxy substituents are disclosed by Sparling et al. in Biomed. Mass Spectrum (1980), 7(1), 13–19.

In the reaction scheme 2,2-halogenated dialkoxybiphenyl is used as a starting material for synthesizing a compound VI-1 of the present invention and its geometric isomer compound VI-2. First, the compound I can be prepared by mono-halogenizing dialkoxybiphenyl, and a preparation method thereof is described by Jandrue et al. in WO 9304403 and Geiger at el. in Chim. Ther. (1966), (7), 425–37.

In order to adjust the length of an alkyl chain, two alkoxy groups are substituted by two hydroxy groups to obtain the compound II, and a similar reaction is disclosed by McOmie et al. in Tetrahedron, 1968, 24, 2289. Then, the compound II having two hydroxy groups is reacted with alkyl halogen having a different chain length to obtain the compound III having $C_2$, $C_6$, $C_8$, $C_{12}$ or $C_{22}$ alkyl groups.

To the compound III is added 2,7-dihalogenated fluorene-9-one to obtain the compound IV. The present inventors obtained the compound IV using a metal-ligand substitution reaction. That is to say, metallic lithium and halogen ligand in the compound III were subjected to a metal-ligand substitution reaction and 2,7-dibromo fluorene-9-one was then added to obtain the compound IV. Here, in order to prevent an exchange reaction between bromine in 2,7-dibromo fluorene-9-one and metallic lithium, excess 2,7-dibromo fluorene-9-one is preferably added.

Then, cyclization of the compound IV gave the compounds V-1 and V-2 which are geometrically isomers. The cyclization was carried out by agitating the compound IV with polyphosphate at a temperature of about 50° C. to about 60° C. The cyclization occurs because electrons can be easily released at 2,4-positions of an alkoxy group. In particular, the compound V-1 produced at the 4-position of an alkoxy group at which electrons could be more easily released than at the 2-position, was produced at a higher yield when the reaction temperature was lowered. However, under the above conditions, the yield of the compound V-1 relative to the compound V-2 was 70% or less. As the result of research conducted for finding out more efficient reaction conditions, 94% or more of the compound V-1 relative to the compound V-2 was acquired in the presence of hydrochloric acid and acetic acid. Finally, Suzuki reactions of the compounds V-1 and V2 with phenyl boric acid and bisphenyl boric acid provided target compounds VI-1 (in the cases where m=n=1 and m=n=2) and VI-2 (in the cases where m=n=1 and m=n=2), respectively. The compounds VI-1 and VI-2 in which m=n=3, were acquired by the Suzuki reaction represented by the reaction scheme 3:

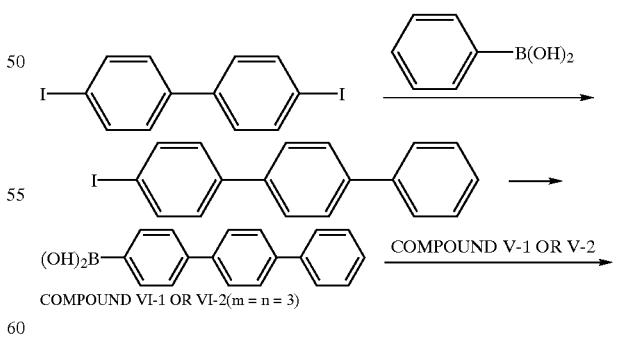

As shown in the reaction scheme 3, the compounds VI-1 and VI-2 in which m=n=3 were produced by Suzuki reactions of the compounds V-1 and V-2 with iodo terphenyl, respectively. The iodo terphenyl used herein was prepared by a Suzuki reaction between diiodo phenyl and phenyl boric acid.

Since the dialkyl bisphenylene-spirobifluorene derivative compound according to the present invention is a monomer having an alkyl substituent introduced to a new position, it has high solubility in organic solvents as well as excellent color purity and color stability, thereby having high processibility. Also, the present invention can provide an organic blue EL material having properties good enough to meet requirements as electronic materials, including transmissivity, environment resistance, adhesive strength with respect to a substrate, film-forming property, electric field stability and so on.

Now, detailed examples of preparing bisphenylene-spirobifluorene compounds according to the present invention and manufacturing EL devices using the same will be described.

EXAMPLE 1

Preparation of 2-bromo-5,3'-dimethoxybiphenyl 3,3'-dimethoxybiphenyl (5.0 g, 23.34 mmol) was dissolved in a dimethylformamide solvent and cooled to 0° C. N-bromosuccinimide (4.15 g, 23.34 mmol) was dissolved in a dimethylformamide solvent (63 ml) and added slowly to a solution of 3,3'-dimethoxybiphenyl for about 1.5 hours. The mixture was stirred at room temperature for about 12 hours and distilled water was added thereto, followed by stirring for about 10 minutes. The resultant was filtered three times with hexane and the filtrate was washed three times with distilled water and dried over sodium sulfate. Hexane was removed under reduced pressure to obtain a desired product (Yield: 6.70 g, 98%). The obtained product was identified as 2-bromo-5,3'-dimethoxybiphenyl through the nuclear magnetic resonance (NMR) spectrum, corresponding to the compound I of the reaction scheme 2.

$\delta_H$ (CDCl$_3$, 400 MHz), 7.52 (d, 1H), 7.33 (t, 1H), 6.97 (d, 1H), 6.93 (m, 2H), 6.88 (s, 1H), 6.75 (dd, 1H), 3.83 (s, 3H), 3.79 (s, 3H), $\delta_C$ (CDCl$_3$, 75 MHz), $\delta$ 159.1, 158.7, 143.2, 142.4, 133.7, 129.0, 121.7, 116.5, 115.0, 114.8, 113.3, 112.9, 55.5, 55.3.

EXAMPLE 2

Preparation of 6-bromo-biphenyl-3,3'-diol

A solution of boron tribromide (137 ml, 1M, 137.12 mmol dissolved in dichloromethane) was slowly added to the compound I (6.70 g, 22.85 mmol) prepared in Example 1 at 0° C., followed by stirring for 1 hour. The stirred solution was allowed to warm to room temperature and continuously stirred for about 12 hours. A small amount of ice water was slowly added to the reactant mixture, followed by filtering three times with dichloromethane, washing three times with distilled water, drying with sodium sulfate. Then, the dichloromethane solvent was removed under reduced pressure to obtain a residual product. Purification by silica gel chromatography using 4% ethyl acetate in dichloromethane gave 6-bromo-biphenyl-3,3'-diol corresponding to the compound II of the reaction scheme 2 (Yield: 5.92 g, 98%). The product was identified through the NMR spectrum that it had the identical structure with the compound II of the reaction scheme 2.

$\delta_H$ (CDCl$_3$, 400 MHz), 7.44 (d, 1H), 7.25 (t, 1H), 6.92 (d, 1H), 6.84 (d, 1H), 6.83 (s, 1H), 6.78 (d, 1H), 6.68 (dd, H), 5.73 (s, 1H), 5.54 (s, 1H); $\delta_C$ (CDCl$_3$, 75 MHz), $\delta$ 155.0, 154.9, 143.1, 142.3, 133.9, 129.2, 121.8, 118.1, 116.3, 116.2, 114.7, 112.8.

EXAMPLE 3

Preparation of 2-bromo-5,3'-bis-octyloxy-biphenyl 6-bromo-biphenyl-3,3'-diol (5.92 g, 22.43 mmol) prepared in Example 2, 1-octanebromide, potassium carbonate (18.60 g, 134.56 mmol) and potassium iodide (3.72 g, 22.43 mmol) were dissolved in dimethylformamide (60 ml), followed by heating for about 24 hours at about 150° C. After cooling to room temperature, distilled water was added to the resultant and stirred for about 10 minutes, followed by filtering three times with hexane, washing three times with distilled water, drying with sodium sulfate. Then, the hexane was concentrated under reduced pressure. Purification by silica gel chromatography using 4% dichloromethane in hexane gave 2-bromo-5,3'-bis-octyloxy-biphenyl corresponding to the compound III of the reaction scheme 2 (Yield: 6.36 g, 58.1%), $R_1$ and $R_2$ in the formula of the compound III being each independently octyl. The product was identified through the NMR spectrum and element analysis that it had the identical structure with the compound III of the reaction scheme 2.

$\delta_H$ (CDCl$_3$, 300 MHz), 7.49 (d, 1H), 7.30 (t, 1H), 6.96–6.76 (m, 4H), 6.74 (dd, 1H), 3.98 (t, 2H), 3.91 (t, 2H), 1.80–1.74 (dt, 4H), 1.44 (dt, 4H), 1.27 (m, 16H), 0.88 (t, 6H); $\delta_C$ (CDCl$_3$, 75 MHz), $\delta$ 158.7, 158.3, 143.3, 142.4, 133.6, 128.9, 121.5, 117.5, 115.5, 115.3, 113.9, 112.7, 68.3, 68.1, 31.81, 31.78, 29.36, 29.30, 29.29, 29.23, 29.21, 29.17, 26.06, 25.98, 22.64, 14.1. Calc. for $C_{28}H_{41}BrO_2$: C, 68.70; H, 8.44.

Found: C, 68.70; H, 8.50.

EXAMPLE 4

Preparation of 9-(5,3'-bis-octyloxy-biphenyl-2-yl)-2,7-dibromo-9H-fluorene-9-ol 2-bromo-5,3'-bis-octyloxy-biphenyl (0.598 g, 1.225 mmol) prepared in Example 3 was dissolved in dried THF (30 ml) and cooled to −78° C. Then, t-butyllithium (t-BuLi) (1.7M, 1.44 ml, 2.45 mmol) was added slowly. The obtained resultant was stirred for about 1 hour at −78° C. After 1 hour, 2,7-dibromofluorene-9-one (0.497 g, 1.47 mmol) dissolved in dried THF (20 ml) was added slowly, stirred for about 1 hour, allowed to warm to room temperature and further stirred at room temperature for about 30 minutes. A small amount of distilled water was added to complete the reaction and saturated brine was added to the resultant. The organic layer was filtered twice with ether and dried over sulfate, and the ether was concentrated under reduced pressure. Purification by silica gel chromatography using 30 to 40% dichloromethane in hexane gave 9-(5,4'-bis-octyloxy-biphenyl-2-yl)-2,7-dibromo-9H-fluorene-9-ol corresponding to the compound IV of the reaction scheme 2 (Yield: 0.62 g, 68%), $R_1$ and $R_2$ in the formula of the compound IV being each independently octyl and $Y_1$ and $Y_2$ being bromine. The product was identified through the NMR spectrum and element analysis that it had the identical structure with the compound IV.

$\delta_H$ (CD$_2$Cl$_2$, 400 MHz), 8.25 (d, 1H), 7.36–7.29 (m, 4H), 7.07–7.02 (m, 3H), 6.54 (t, 1H), 6.48 (d, 1H), 6.39 (dd, 1H), 5.65 (t, 1H), 5.61 (d, 1H), 3.94 (t, 2H), 3.52 (t, 2H), 2.41 (s, 1H), 1.76 (m, 2H), 1.59 (m, 2H), 1.42 (m, 4H), 1.34–1.27 (m, 16H), 0.90 (t, 3H), 0.88 (t, 3H). Calc. for $C_{41}H_{48}Br_2O_3$: C, 65.78; H, 6.46. Found: C, 65.90; H, 6.50.

EXAMPLE 5

Preparation of 2,7-dibromo-3',6'-bisoctyloxy-9,9'-spirobisfluorene and 2,7-dibromo-1',6'-bisoctyloxy-9,9'-spirobisfluorene The compound prepared in Example 4 (0.5 g, 0.668 mmol) was mixed with acetic acid (50 ml) and hydrochloric acid (1 ml) and stirred for about 22 hours at room temperature. After completing the reaction by adding a small amount of distilled water, the organic layer was filtered three times with dichloromethane, dried with sodium sulfate. Then, the dichloromethane was concentrated under reduced pressure. Purification by silica gel chromatography using 4% dichloromethane in hexane gave 2,7-dibromo-3',6'-bisoctyloxy-9,9'-spirobisfluorene corresponding to the compound V-1 of the reaction scheme 2 (Yield: 0.46 g, 94%), $R_1$ and $R_2$ in the formula of the compound V-1 being each independently octyl and $Y_1$ and $Y_2$ being bromine. In the same manner, 2,7-dibromo-1',6'-bisoctyloxy-9,9'-spirobisfluorene, which is a geometric isomer of the compound V-1, corresponding to the compound V-2 of the reaction scheme 2 (Yield: 0.024 g, 5%), $R_1$ and $R_2$ in the formula of the compound V-2 being each independently octyl and $Y_1$ and $Y_2$ being bromine. The compound V-1 of the reaction scheme 2 was prepared by recrystallization using a mixed solvent of hexane and dichloromethane. The products were identified through the NMR spectrum and element analysis that they had the identical structures with the compounds V-1 and V-2.

Compound V-1: $\delta_H$ (CDCl$_3$, 400 MHz), 7.60 (d, 2H), 7.44 (dd, 2H), 7.29 (d, 2H), 6.82 (d, 2H), 6.66 (dd, 2H), 6.56 (d, 2H), 4.02 (t, 4H), 1.80 (m, 4H), 1.47 (m, 4H), 1.31 (m, 16H), 0.88 (t, 6H), $\delta_H$ (CDCl$_3$, 400 MHz), 159.7, 151.1, 143.0, 139.6, 139.4, 130.9, 127.3, 124.6, 121.8, 121.2, 114.7, 105.9, 68.3, 64.4, 31.8, 29.4, 29.3, 26.1, 22.7, 14.1. Calc. for $C_{41}H_{46}Br_2O_2$: C, 67.40; H, 6.35. Found: C, 67.45; H, 6.40.

Compound V-2: $\delta_C$ (CDCl$_3$, 400 MHz), 7.59 (d, 2H), 7.43–7.30 (m, 5H), 6.83 (d, 2H), 6.64–6.62 (m, 2H), 6.51 (d, 1H), 4.01 (t, 2H), 3.51 (t, 2H), 1.81 (quint, 2H), 1.49 (m, 2H), 1.34–1.24 (m, 12H), 1.08 (m, 4H), 1.02 (m, 4H), 0.88 (m, 6H), $\delta_C$ (CDCl$_3$, 400 MHz), 159.6, 155.2, 150.0, 143.5, 143.0, 140.2, 139.3, 134.2, 130.4, 123.0, 126.6, 124.4, 121.4, 120.8, 114.6, 112.1, 111.1, 106.2, 68.3, 67.3, 63.7, 31.9, 31.8, 29.4, 29.3, 29.2, 28.9, 26.1, 25.4, 22.7, 22.7, 14.2, 14.1.

EXAMPLE 6

Preparation of 2,7-bisphenyl-3',6'-bisoctyloxy-9,9'-spirobisfluorene

Figure 2:
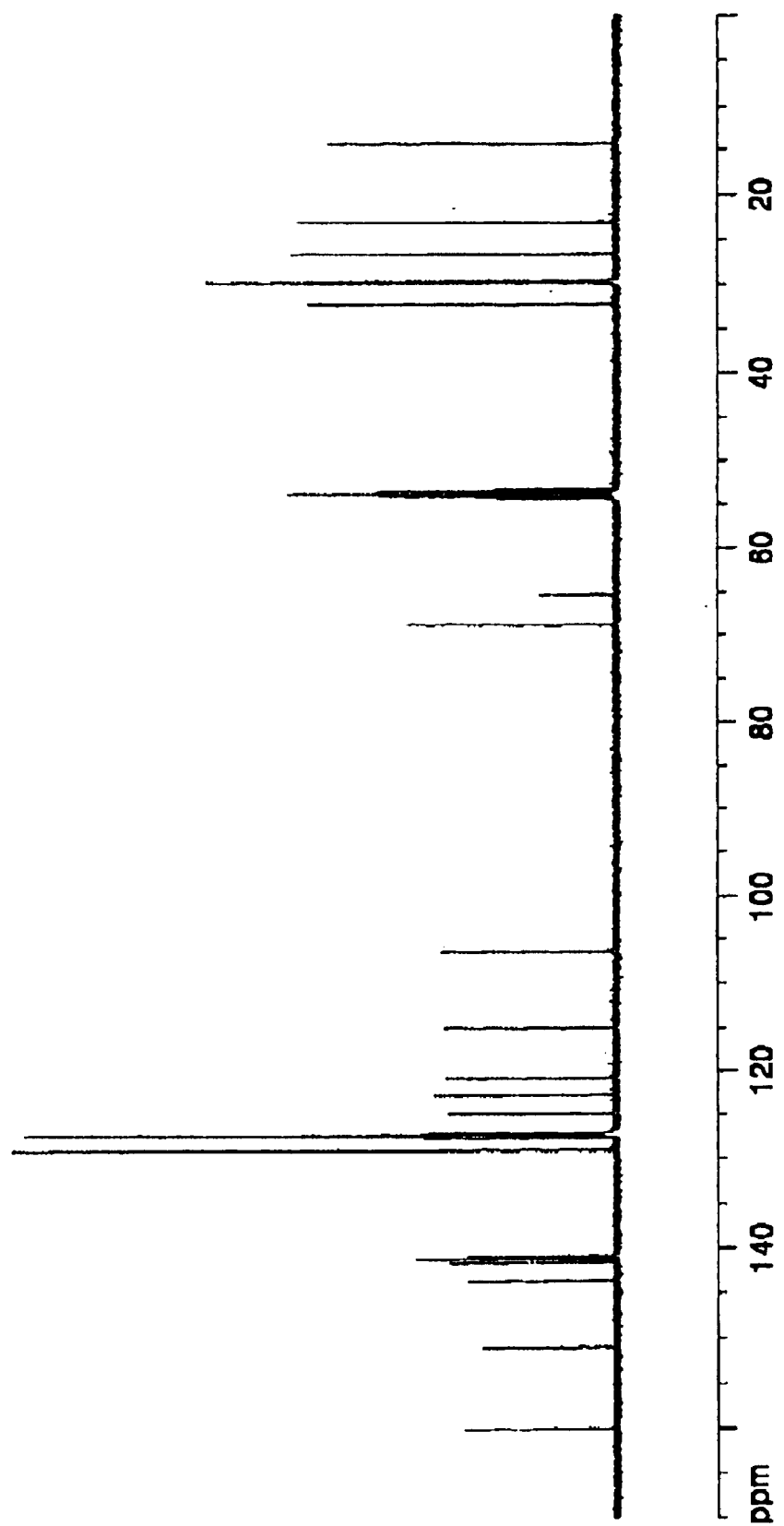
FIG. 2 is a carbon NMR of a compound VI-1 (m=1, n=1) prepared in Example 6.

The compound was prepared under Suzuki reaction conditions. The compound V-1 prepared in Example 5 (0.5 g, 0.68 mmol), 4-phenyl boric acid (0.21 g, 1.71 mmol), tetrakis(triphenylphosphine)palladium (0.24 g, 0.20 mmol), 2M-sodium carbonate (2.1 ml, 4.10 mmol) and toluene (29 ml) were simultaneously mixed, freezed under liquid nitrogen, evacuated by a vacuum pump and then warmed to room temperature to be melted. This procedure was repeated twice, followed by injection of nitrogen. The mixed solution was refluxed for 2 days and cooled to room temperature. Thereafter, a small amount of distilled water was added, and the organic layer was filtered three times with dichloromethane, dried with sodium sulfate. Then, the dichloromethane was concentrated under reduced pressure. Purification by silica gel chromatography using 10% dichloromethane in hexane, followed by recrystallization using a mixed solvent of hexane and dichloromethane gave the compound VI-1 of the reaction scheme 2 (Yield: 0.407 g, 82%), $R_1$ and $R_2$ in the formula of the compound VI-1 being each independently octyl and m and n being 1. FIGS. 1 and 2 show the proton NMR spectrum and carbon NMR of the obtained compound VI-1.

$\delta_H$ (CD$_2$Cl$_2$, 400 MHz), 7.96 (d, 2H), 7.68 (dd, 2H), 7.48–7.45 (m, 6H), 7.34–7.32 (m, 4H), 7.26 (m, 2H), 7.02 (d, 2H), 6.71 (d, 4H), 4.07 (t, 4H), 1.85 (quint, 4H), 1.53 (quint, 4H), 1.44–1.35 (quint, 16H), 0.94 (t, 6H), $\delta_C$ (CD$_2$Cl$_2$, 400 MHz), 160.0, 150.9, 143.6, 141.6, 141.19, 141.18, 140.9, 129.0, 127.6, 127.3, 127.1, 124.9, 122.7, 120.8, 115.0, 106.3, 68.8, 65.3, 32.3, 29.82, 29.81, 29.7, 26.5, 23.1, 14.3. Cald. for $C_{53}H_{56}O_2$: C, 87.80; H, 7.79. Found: C, 87.80; H, 7.77.

EXAMPLE 7

Preparation of 2,7-bisbiphenyl-3',6'-bisoctyloxy-9,9'-spirobisfluorene

Figure 3:
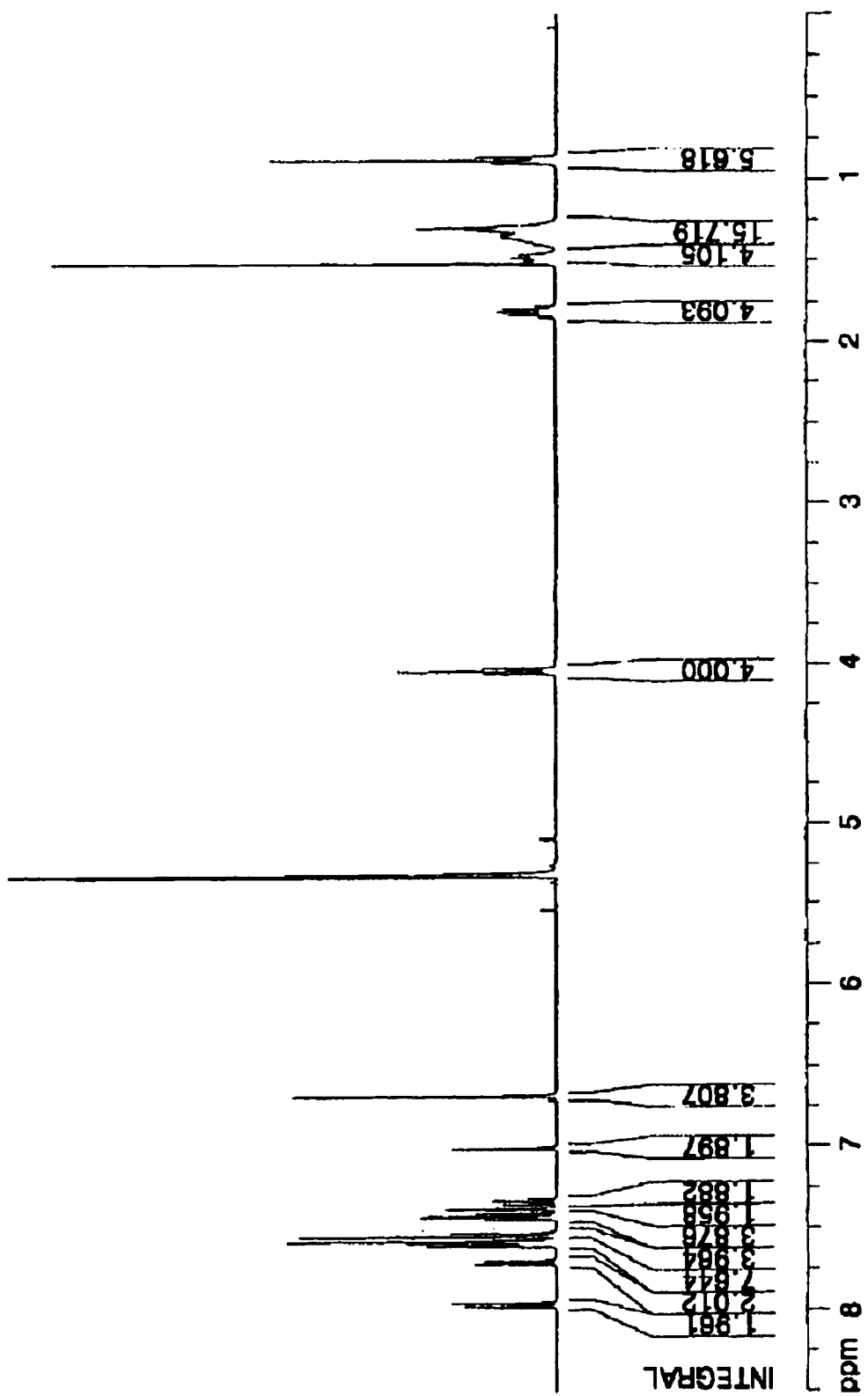
FIG. 3 is a proton NMR of a compound VI-1 (m=2, n=2) prepared in Example 7.
Figure 4:
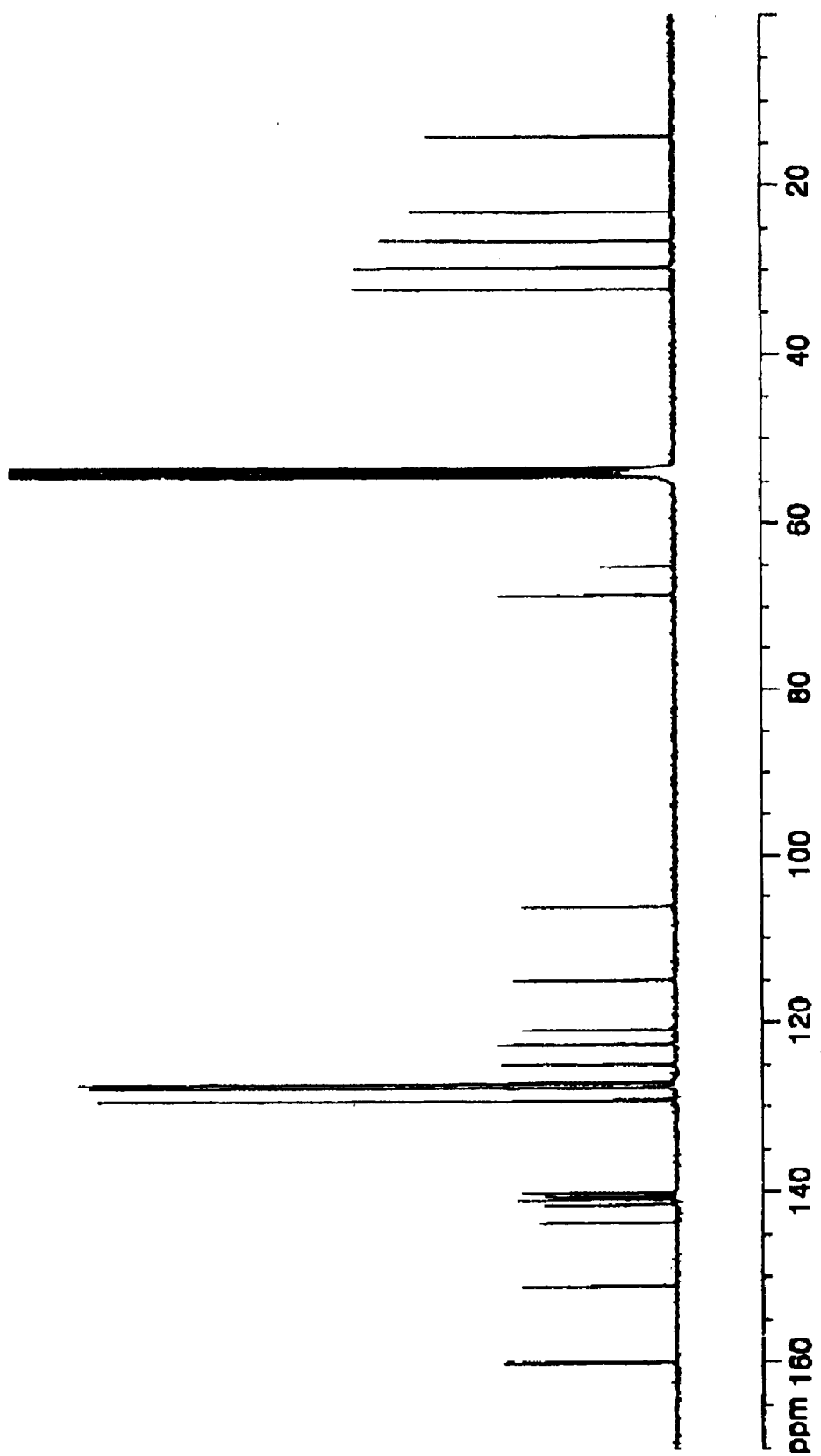
FIG. 4 is a carbon NMR of a compound VI-1 (m=2, n=2) prepared in Example 7.
Figure 5:
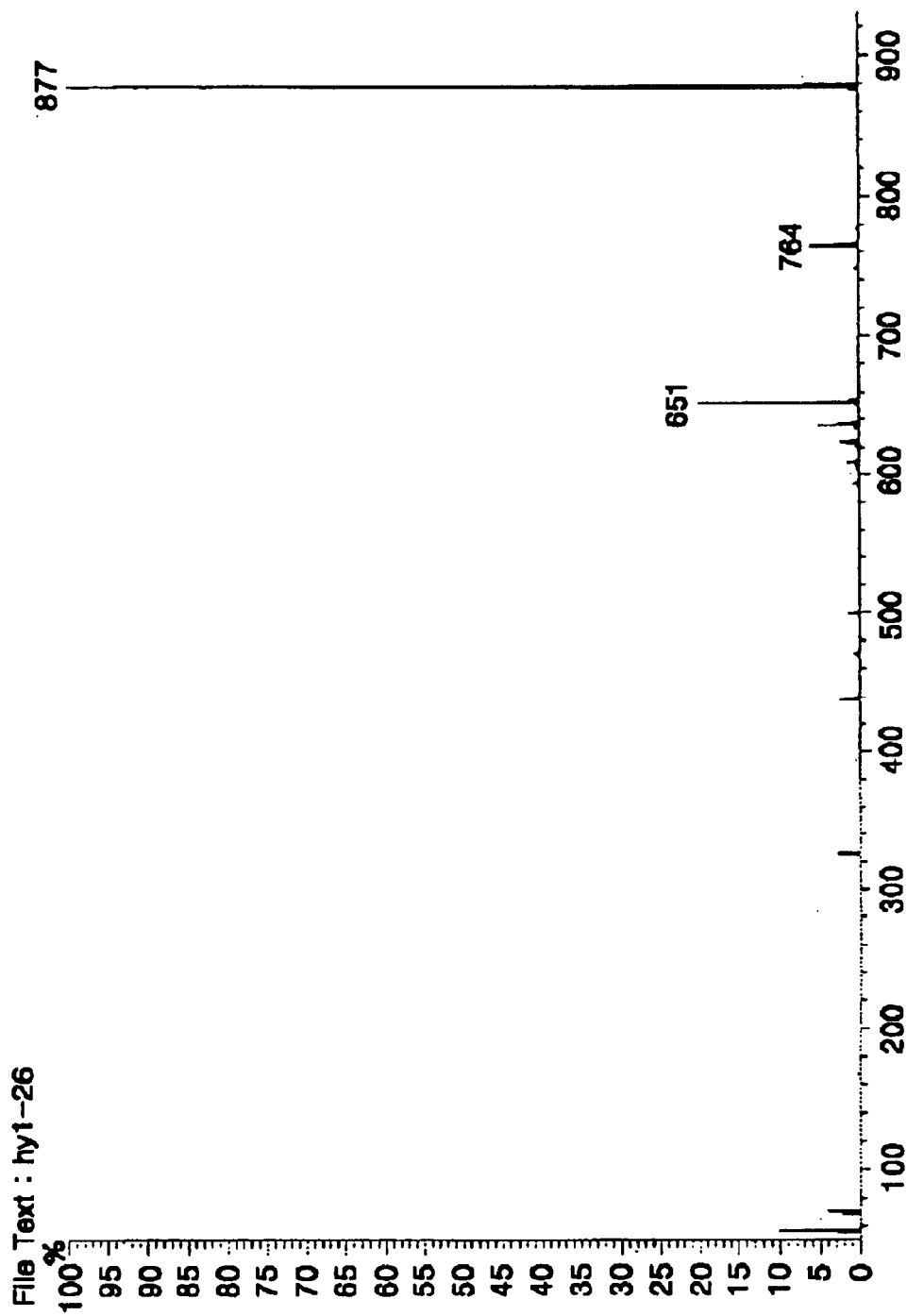
FIG. 5 is a mass spectrum of a compound VI-1 (m=2, n=2) prepared in Example 7.

The compound was prepared under Suzuki reaction conditions. The compound V-1 prepared in Example 5 (0.35 mmol), 4-phenyl boric acid (0.89 mmol), tetrakis (triphenylphosphine)palladium (0.123 mmol), 2M-sodium carbonate (1.06 ml) and toluene (15 ml) were simultaneously mixed, freezed under liquid nitrogen, evacuated by a vacuum pump and then warmed to room temperature to be melted. This procedure was repeated twice, followed by injection of nitrogen. The mixed solution was refluxed for 2 days and cooled to room temperature. Thereafter, a small amount of distilled water was added, and the organic layer was filtered three times with dichloromethane, dried with sodium sulfate. Then, the dichloromethane was concentrated under reduced pressure. Purification by silica gel chromatography using 20% dichloromethane in hexane, followed by recrystallization using a mixed solvent of hexane and dichloromethane gave 2,7-bisbiphenyl-3',6'-bisoctyloxy-9,9'-spirobisfluorene corresponding to the compound VI-1 (Yield: 0.281 g, 90%), $R_1$ and $R_2$ in the formula of the compound VI-1 being each independently octyl and m and n being 2. The product was identified through the NMR spectrum and element analysis that it had the identical structure with the compound VI-1. FIGS. 3, 4 and 5 show the proton NMR spectrum, carbon NMR spectrum and mass spectrum of the obtained compound VI-1.

$\delta_H$ (CD$_2$Cl$_2$, 400 MHz), 7.96 (d, 2H), 7.68 (dd, 2H), 7.59–7.52 (m, 12H), 7.40–7.38 (m, 8H), 7.01 (d, 2H), 6.68 (d, 4H), 4.04 (t, 4H), 1.80 (quint, 4H), 1.48 (quint, 4H), 1.40–1.29 (quint, 16H), 0.89 (t, 6H), $\delta_C$ (CD$_2$Cl$_2$, 400 MHz), 159.3, 150.9, 143.5, 141.4, 140.9, 140.8, 140.2, 140.0, 129.1, 127.7, 127.5, 127.2, 126.9, 124.9, 122.5, 120.8, 114.9, 106.1, 68.7, 65.2, 32.2, 29.8, 29.7, 29.6, 26.4, 23.0, 14.2. Calc. for $C_{65}H_{64}O_2$: C, 89.00; H, 7.35. Found: C, 88.85; H, 7.68. m/z (EI-MS): Cald. 877.20 Found 877.10.

EXAMPLE 8

Preparation of 4"-iodo[1,1',4',1"]terphenyl

Figure 6:
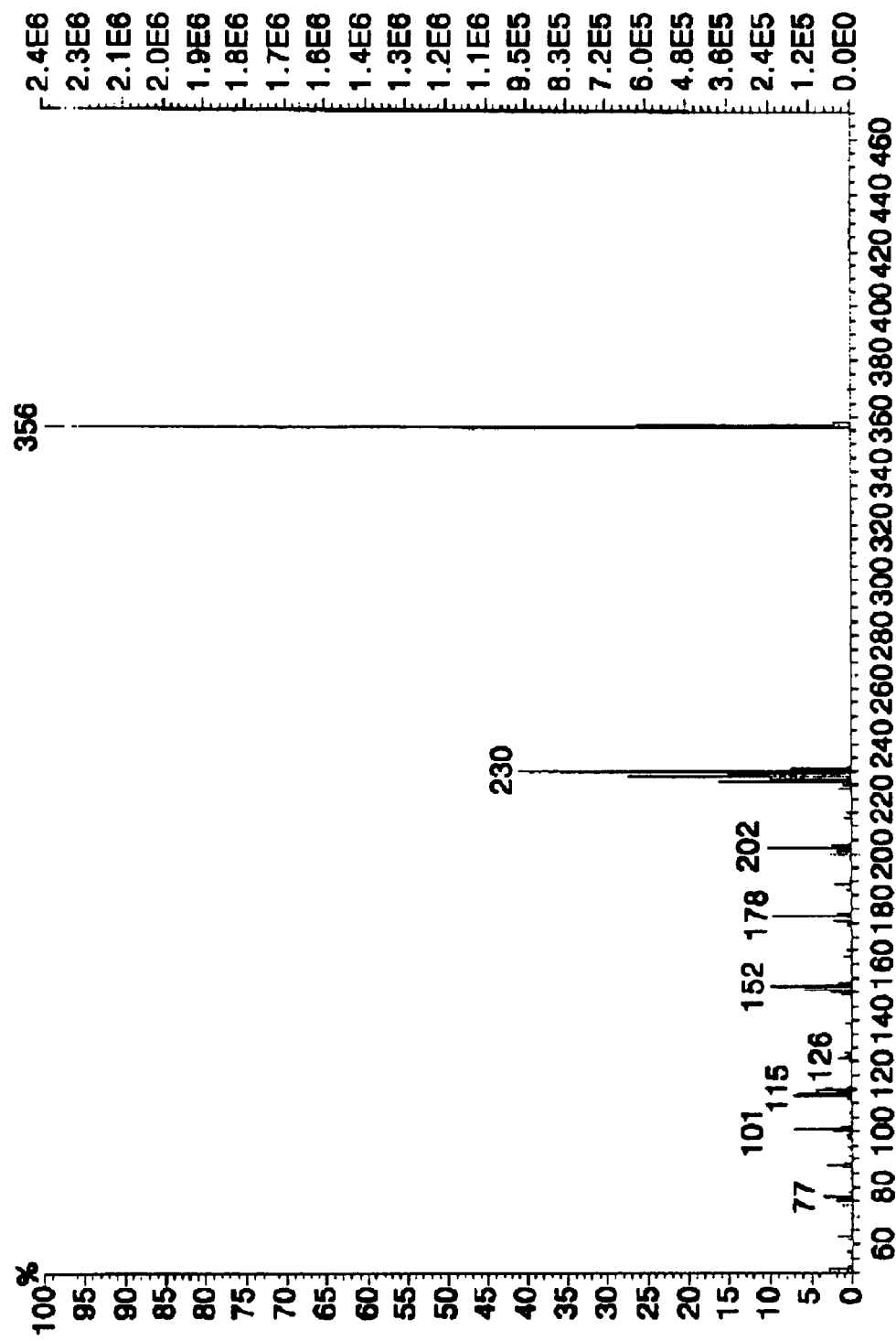
FIG. 6 is a mass spectrum of a compound prepared in Example 8.

The compound was prepared under Suzuki reaction conditions. 4,4'-diiodo-biphenyl (1.0 g, 2.46 mmol), phenyl boric acid (0.24 g, 1.970 mmol), tetrakis (triphenylphosphine)palladium (0.085 g, 0.074 mmol), 2M-sodium carbonate (12.3 ml) and toluene (76 ml) were simultaneously mixed, freezed under liquid nitrogen, evacuated by a vacuum pump and then warmed to room temperature to be melted. This procedure was repeated twice, followed by injection of nitrogen. The mixed solution was refluxed for 2 days and cooled to room temperature. Thereafter, a small amount of distilled water was added, and the organic layer was filtered three times with dichloromethane, dried with sodium sulfate. Then, the dichloromethane was concentrated under reduced pressure. Purification by silica gel chromatography using 1% dichloromethane in hexane gave 4"-iodo-[1,1',4',1"]terphenyl (Yield: 0.245 g, 35%). The structure of the product was identified through the NMR spectrum and mass spectrum. FIG. 6 shows the mass spectrum of 4"-iodo-[1,1',4',1"]terphenyl.

m/z (EI-MS): Cald. 356.01 Found 356.0

EXAMPLE 9

Preparation of 2,7-diterphenyl-3',6'-bisoctyloxy-9,9'-spirobisfluorene

Figure 7:
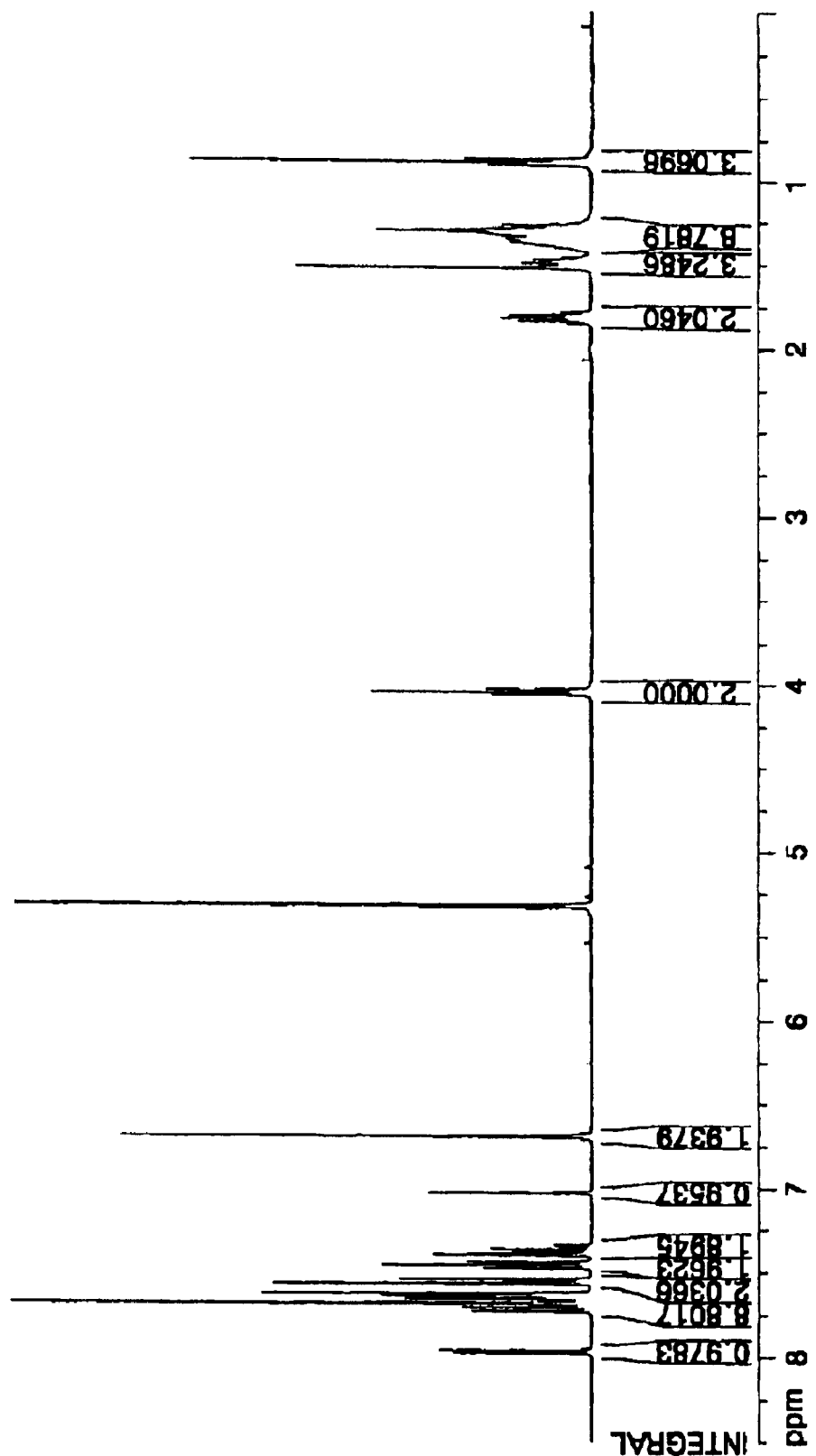
FIG. 7 is a proton NMR of a compound VI-1 (m=3, n=3) prepared in Example 9.
Figure 8:
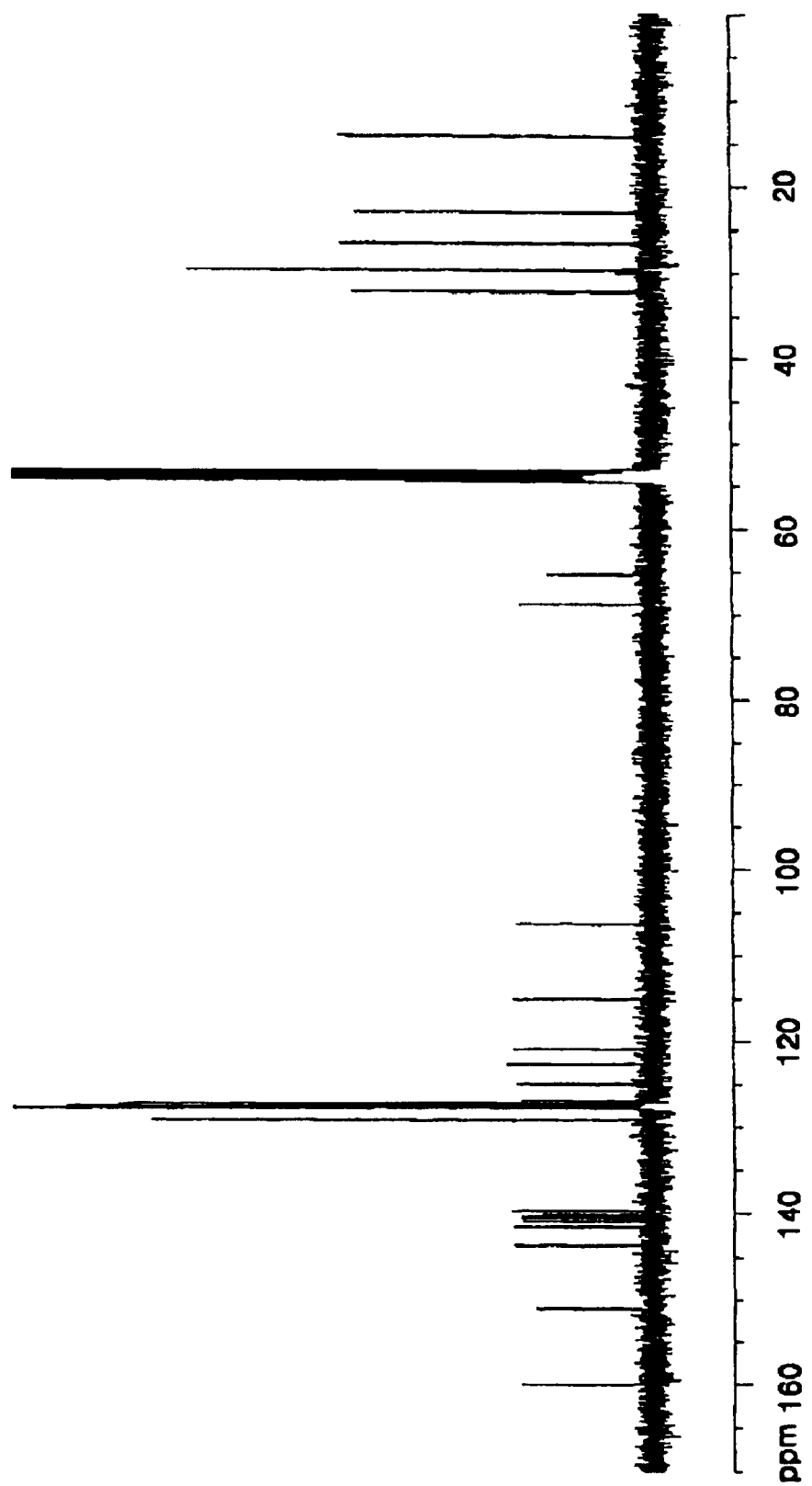
FIG. 8 is a carbon NMR of a compound VI-1 (m=3, n=3) prepared in Example 7.

Bis(pinacolnato)diboron (0.209 g, 0.821 mmol), 4"-iodo-[1,1',4',1"]terphenyl prepared in Example 8 (0.098 g, 0.274 mmol), [1,1'bis(diphenylphospino)perocine]dichloropalladium (0.007 g, 0.0082 mmol), potassium acetate (0.08 g, 0.821 mmol) and diformaldehyde (2 ml) were simultaneously mixed and evacuated by a vacuum pump, followed by injection of nitrogen and stirring at about 80° C. for about 3 hours. Then, the compound V-1 prepared in Example 5 (0.10 g, 0.137 mmol), tetrakis(triphenylphosphine)palladium (0.01 g, 0.821 mmol) and 2M-sodium carbonate (0.174 g, 1.64 mmol) were mixed, freezed under liquid nitrogen, evacuated by a vacuum pump and then warmed to room temperature to be melted. This procedure was repeated twice, followed by injection of nitrogen. The mixed solution was refluxed for 2 days and cooled to room temperature. Thereafter, a small amount of distilled water was added, and the organic layer was filtered three times with dichloromethane, dried with sodium sulfate. Then, the dichloromethane was concentrated under reduced pressure. Purification by silica gel chromatography using 1% dichloromethane in hexane gave 2,7-diterphenyl-3',6'-bisoctyloxy-9,9'-spirobifluorene (Yield: 0.085 g, 30%). The product was identified through the NMR spectrum and element analysis that it had the identical structure with the compound VI-1 of the reaction scheme 2 ($R_1$=octyl, $R_2$=octyl, m=3 and n=3). FIGS. 7 and 8 show the proton NMR spectrum and carbon NMR spectrum of the obtained compound VI-1.

$\delta_H$ (CD$_2$Cl$_2$, 400 MHz), 7.97 (d, 2H), 7.68–7.63 (m, 18H), 7.55 (d, 4H), 7.45 (m, 4H), 7.39 (m, 4H), 7.02 (t, 2H), 6.69 (d, 4H), 4.05 (t, 4H), 1.82 (quint, 4H), 1.50 (m, 4H), 1.36–1.27 (m, 16H), 0.89 (t, 6H), $\delta_C$ (CD$_2$Cl$_2$, 400 MHz), 160.0, 151.0, 143.6, 141.5, 141.0, 140.9, 140.6, 140.4, 140.2, 139.7, 139.65, 129.2, 127.77, 127.69, 127.56, 127.45, 127.26, 127.0, 124.9, 122.6, 120.9, 115.0, 106.2, 68.8, 65.3, 32.2, 29.8, 29.7, 26.5, 23.0, 14.2. m/z (EI-MS): Cald. 1029.39 Found 1029.0.

EXAMPLE 10

Manufacture of EL Device Using dialkyl bisphenylene-spirobifluorene Compound

Figure 9:
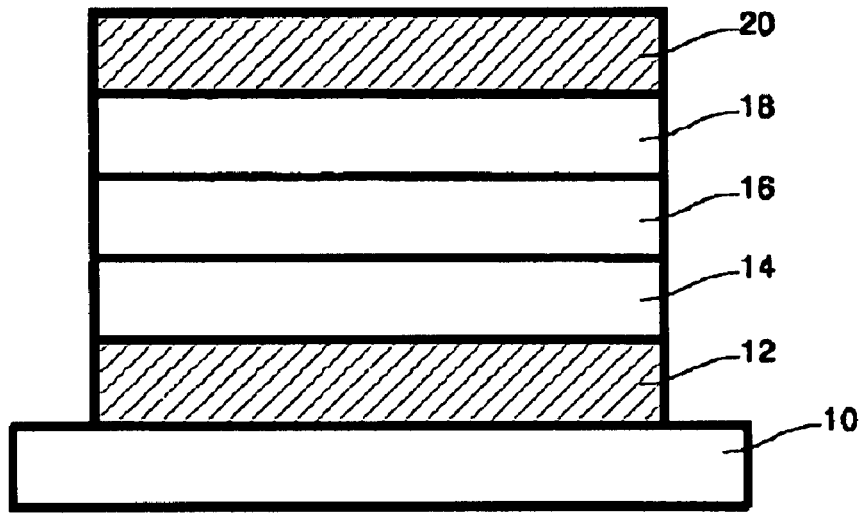
FIG. 9 is a cross-sectional view illustrating a method of manufacturing an electroluminescence (EL) device according to the present invention.

The EL device was manufactured using the compound VI-1 prepared in Example 7 ($R_1$=octyl, $R_2$=octyl, m=2 and n=2), which will now be described in detail with reference to FIG. 9. A glass substrate 10 having a transparent electrode 12 made of indium tin oxide (ITO) patterned thereon was cleaned, and then a hole-transporting layer 14, a light emitting layer 16, an electron transporting layer 18 and an anode 20 were sequentially deposited on the transparent electrode 12 by thermal deposition under a pressure of $10^{-6}$ torr or less.

Figure 10:
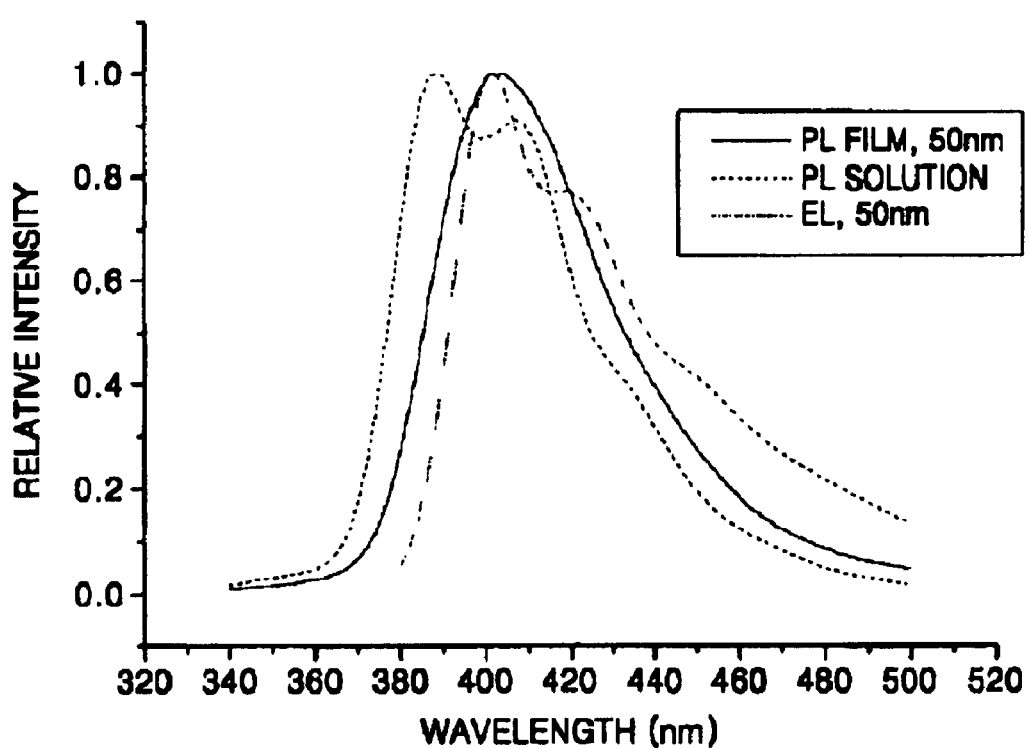
FIG. 10 is a graph depicting the photoluminescence (PL) and EL spectra for an EL device manufactured in Example 10.

The photoluminescence (PL) and EL spectra were measured and shown in FIG. 10. In FIG. 10, the maximum emission peak is 402 nm and blue EL is displayed in the range from 400 to 500 nm. The CIE color coordinate of light emitted is (0.16, 0.09), that is, blue with high color purity, exhibiting high luminance and high emission efficiency.

While the invention has been described in terms of specific examples, the substrate 10 may be formed of not only glass but also polycarbonate, polyimide, polyethyleneterephthalate or polyethylenenaphthalate. Also, the transparent electrode 12 may be formed of indium tin oxide, tin oxide, zinc oxide or combinations thereof. The transparent electrode 12 may be formed by mixing these exemplary materials in an appropriate ratio according to the requirements in view of transmissivity and conductivity, using a sputtering method. The bisphenylene-spirobifluorene compound according to the present invention is a monomer having an alkyl substituent introduced to a new position. The alkyl side chains can serve to reduce an intermolecular interaction by preventing π-π interactions of phenylene groups of spirobifluorene, resulting in reducing the excimer formation and keeping the color purity. In other words, in the spirobifluorene compound according to the present invention, one fluorene ring has an alkyl substituent for increasing solubility in organic solvents and reducing intermolecular interaction, and two phenylene groups are introduced to the other fluorene ring for enhancing blue EL property. Thus, the bisphenylene-spirobifluorene compound according to the present invention has high solubility in organic solvents as well as excellent color purity and color stability, thereby having high processibility. Also, the present invention can provide an organic blue EL material having properties good enough to meet requirements as electronic materials, including transmissivity, environment resistance, adhesive strength with respect to a substrate, film-forming property, electric field stability and so on. Formation of a light emitting layer of an EL device using the compound according to the present invention noticeably reduces crystallization typically occurring to planar organic materials during formation of a thin film for forming the light emitting layer, thereby extending the life span of the EL device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A bisphenylene-spirobifluorene compound defined by the following formula:

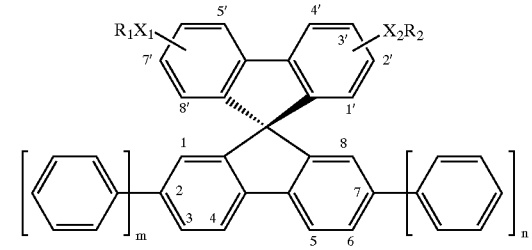

wherein $R_1$ and $R_2$ are identical or different and are independently a straight-chain or branched alkyl group having from 1 to 22 carbon atoms, $X_1$ and $X_2$ are and m and n are integers from 1 to 2.

2. The bisphenylene-spirobifluorene compound according to claim 1, wherein $X_1X_2$ and $X_2X_2$ are at 1', 6'-positions.

3. The bidphenylene-spirobifluorene compound according to claim 1, wherein $X_1R_1$ and $X_1R_2$ and at 1', 6'-positions.

4. An electroluminescence (EL) material comprising the bisphenylene-spirobifluorene compound claimed in any one of claims 1 through 3.

5. The EL material according to claim 4, wherein the bisphenylene-spirobifluorene compound is contained in an amount of 10% by weight or more.

6. An electroluminescence (EL) device comprising:
a cathode;
an anode; and
a light-emitting layer interposed between the cathode and the anode and containing the bisphenylene-spirobifluorene compound as claimed in one of claims 1 through 3.

7. The EL device according to claim 6, wherein the bisphenylene-spirobifluorene compound is contained in the light emitting layer in an amount of 10% to 100% by weight.

* * * * *